United States Patent [19]
Webb et al.

[11] Patent Number: 5,726,865
[45] Date of Patent: Mar. 10, 1998

[54] CIRCUIT BOARD RETENTION SYSTEM

[75] Inventors: Jim Webb; Steve Lofland, both of Portland, Oreg.

[73] Assignee: Intel Corporation, Santa Clara, Calif.

[21] Appl. No.: 665,405

[22] Filed: Jun. 18, 1996

[51] Int. Cl.[6] .................................................. H01R 13/62
[52] U.S. Cl. ................. 361/801; 361/740; 361/759; 361/802; 439/327; 439/328
[58] Field of Search ................................ 361/740, 741, 361/756, 759, 785, 801, 802; 439/59, 62, 64, 325, 327, 328, 377, 636, 637

[56] References Cited

U.S. PATENT DOCUMENTS

| | | | |
|---|---|---|---|
| 5,383,793 | 1/1995 | Hsu et al. | 361/801 |
| 5,417,580 | 5/1995 | Tsai | 439/328 |
| 5,514,002 | 5/1996 | Cheng et al. | 439/637 |
| 5,573,408 | 11/1996 | Laub et al. | 439/62 |

OTHER PUBLICATIONS

A/N: 08/584,300; Filing Date: Jan. 8, 1996 Inventor: Daryl James Nelson Assignee: Intel Corporation.

*Primary Examiner*—Leo P. Picard
*Assistant Examiner*—John B. Vigushin
*Attorney, Agent, or Firm*—Blakely, Sokoloff, Taylor & Zafman

[57] ABSTRACT

An apparatus for retaining a circuit board in a connected position is constituted with at least a first retention arm and a first clip that cooperate with each other and with a first edge of the circuit board to securely retain the first edge. The first retention arm includes a first end that is geometrically shaped to allow the first clip to slide onto the first end and slide towards the first edge. The first edge and the first clip further include first complementary engagement features for the first clip to engage the first edge when the first slip slide up against the first edge. Furthermore, the first end includes a deflectable stop lever that can be depressed to allow the first clip to slide over it, and then be released to snugly engage a first notch of the first clip to keep the first clip from sliding back off the first end.

29 Claims, 7 Drawing Sheets

CIRCUIT BOARD RETENTION SYSTEM

BACKGROUND OF THE INVENTION

1. Field of the Invention

The present invention relates to the field of electronic system packaging. More specifically, it relates to an apparatus for mechanically stabilizing and retaining a circuit board connected to a backplane of an electronic system, e.g. a daughter card connected to a motherboard of a desktop computer.

1. Background Information

For a variety of reasons, including but not limited to interchangeability and expandability, most electronic systems, whether analog or digital, typically are modular in design. Different aspects or functions of a system are implemented on different circuit boards, thus allowing systems of varying degrees in functionality to be easily put together by including or excluding certain circuit boards. It also allows systems to be easily upgraded with additional functions by adding or replacing certain circuit boards.

Very often, one of the circuit boards is considered to be the main circuit board, against which all the other circuit boards are connected. The main circuit board is often referred to as the backplane or the motherboard, whereas the other circuit boards are often referred to as the add-on boards/cards or daughter cards. For example, in the case of personal computers, traditionally, the circuit board where the main components such as the processor and the memory are mounted is considered the motherboard. The expansion or optional functions, such as serial/parallel interfaces, game adapters, graphics and/or video adapters, network adapters, and modems, are implemented using add-on/daughter cards, which are connected to the expansion slots or connectors of the motherboard. However, in recent years, the role of the expansion slots/connectors is beginning to blur, as manufacturers begin to package processors and memory components on daughter cards.

In order for a system to operate properly, the connections between the add-on/daughter cards and the motherboard must be kept unbroken. This is generally not a problem during normal operation. However, when a system is moved or otherwise exposed to mechanical shock and vibration, the connections may become disengaged. The mechanical shock and vibration may come in any number of directions including but not limited to the direction parallel to the motherboard or the direction parallel to the add-on/daughter cards.

A number of approaches have been devised by system manufacturers to address this problem. At one end of the spectrum, the backplane/motherboard and the add-on/daughter cards are housed in a rigid mechanical structure called a card cage, which provides a frame to which daughter cards are attached by clips or screws. This is an effective but expensive solution. At the other end of the spectrum, many I/O add-on cards are retained by providing a bracket at one side edge of the circuit board, and securing the bracket against the rear frame of the system chassis. This is an inexpensive solution. However, it is not suitable for daughter cards that have high rigidity or stability requirements, or daughter cards that are "centrally" located, away from the chassis, e.g. a processor daughter card.

In between, a number of approaches are employed to provide the desired increased rigidity and stability, but without substantial increase in cost. For example, U.S. Pat. No. 5,162,979 disclosed an approach of using two pivotal levers and complementary fulcrums to secure the opposing side edges of a daughter card. The pivotal levers are mounted on opposing ends of the top edge of a daughter card, and the fulcrums are mounted on the two opposing frames of the system chassis. This is also an inexpensive solution. However, it is not suitable for daughter cards that are "centrally" located, away from the chassis, or daughter cards that do not span the entire length/width of the chassis.

Thus, it is desirable to have a circuit board retention apparatus that can offer increased rigidity and stability, but without the cost of the card cage approach, nor requiring the circuit board to span the entire length/width of the chassis. As will be described in more detail below, the circuit board retention apparatus of the present invention achieves these and other desirable results.

SUMMARY OF THE INVENTION

An apparatus for retaining a circuit board in a connected position is constituted with at least a first retention arm and a first clip that cooperate with each other and with a first edge of the circuit board to securely retain the first edge. The first retention arm includes a first end that is geometrically shaped to allow the first clip to slide onto the first end and slide towards the first edge. The first edge and the first clip further include first complementary engagement features for the first clip to engage the first edge when the first clip slides up against the first edge. Furthermore, the first end includes a deflectable stop lever that can be depressed to allow the first clip to slide over it, and then be released to snugly engage a first notch of the first clip to keep the first clip from sliding back off the first end.

In one embodiment, the first end includes a number of channels disposed on opposing side surfaces for the first clip to slide onto the first end. The first edge includes a first cutout, whereas the first clip includes a protruding rib for engaging the first cutout. The first clip further includes a second notch against which the deflectable stop lever can engage to preposition the first clip on the first end.

In one embodiment, the first arm further includes a first plurality of ribs for reinforcing the first arm against bending away from the first edge, and a second plurality of ribs, orthogonal to the first plurality of ribs, for reinforcing the first arm from swaying in either direction orthogonal to the circuit board. The first arm further includes a second end having extended flanges for contributing to the stability of the apparatus. The first and second plurality of ribs, as well as the extended flanges are of the same thickness.

In one embodiment, the apparatus further includes a second arm and a second clip that cooperate with each other and a second edge of the circuit board to securely retain the second edge. The second arm is similarly constituted as the first arm. Likewise, the second clip is similarly constituted as the first clip.

In one embodiment, the apparatus further includes a longitudinal base joining the first and the second arm. The longitudinal base includes a cavity to allow the base to snugly fit over a connector against which the circuit board is connected. The base, and the first and second arms are made of a uni-body construction, and manufactured by injection molding, using glass filled polycarbonate. The clip is made of zinc.

BRIEF DESCRIPTION OF DRAWINGS

The present invention will be described by way of exemplary embodiments, but not limitations, illustrated in the accompanying drawings in which like references denote similar elements, and in which.

DETAILED DESCRIPTION OF THE INVENTION

In the following description, various aspects of the present invention will be described. However, it will be apparent to those skilled in the art that the present invention may be practiced with only some or all aspects of the present invention. For purposes of explanation, specific numbers, materials and configurations are set forth in order to provide a thorough understanding of the present invention. However, it will also be apparent to one skilled in the art that the present invention may be practiced without the specific details. In other instances, well known features are omitted or simplified in order not to obscure the present invention.

Figure 1:
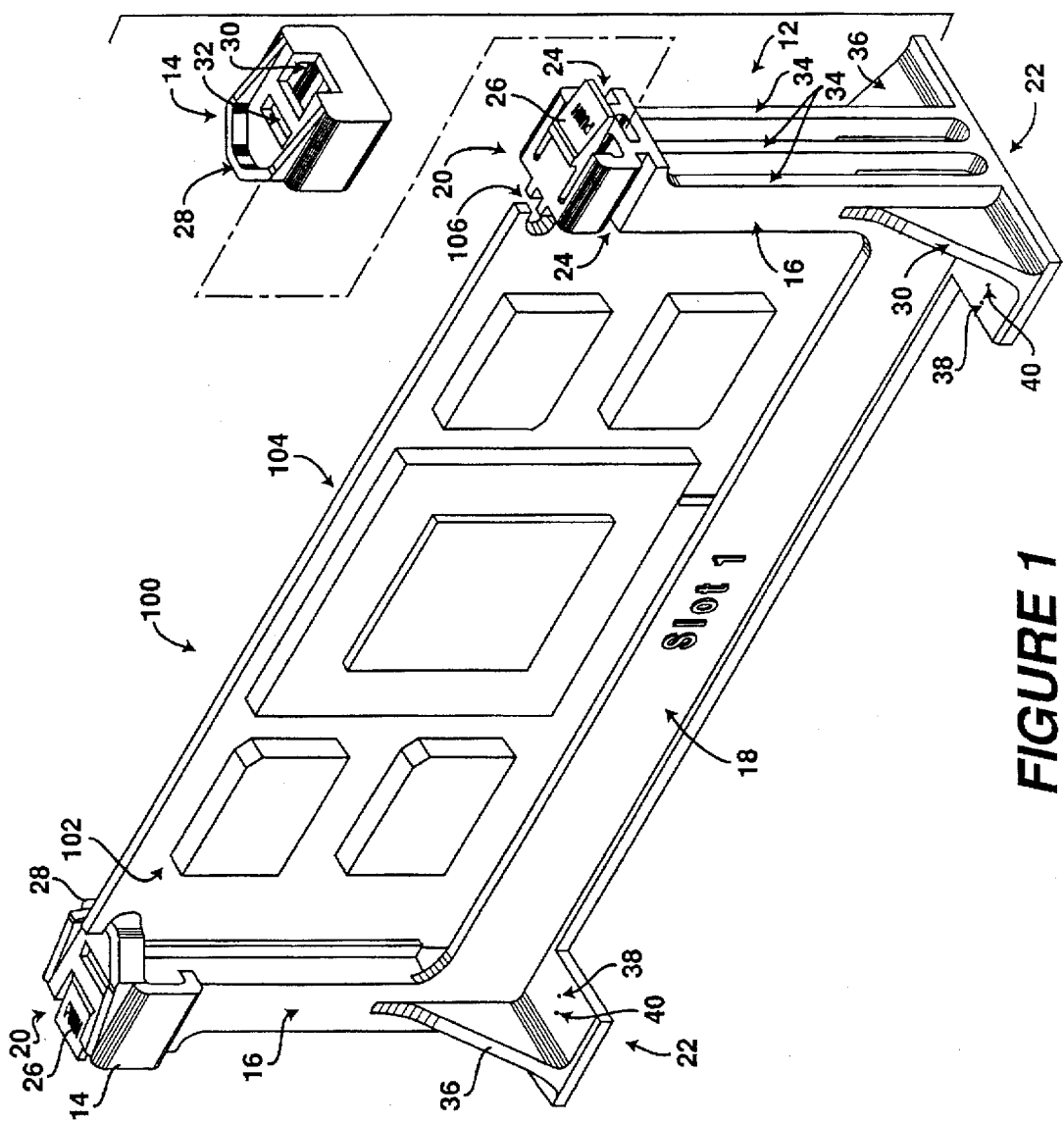
FIG. 1 is a perspective view of one embodiment of the circuit board retaining apparatus of the present invention.
Figure 2:
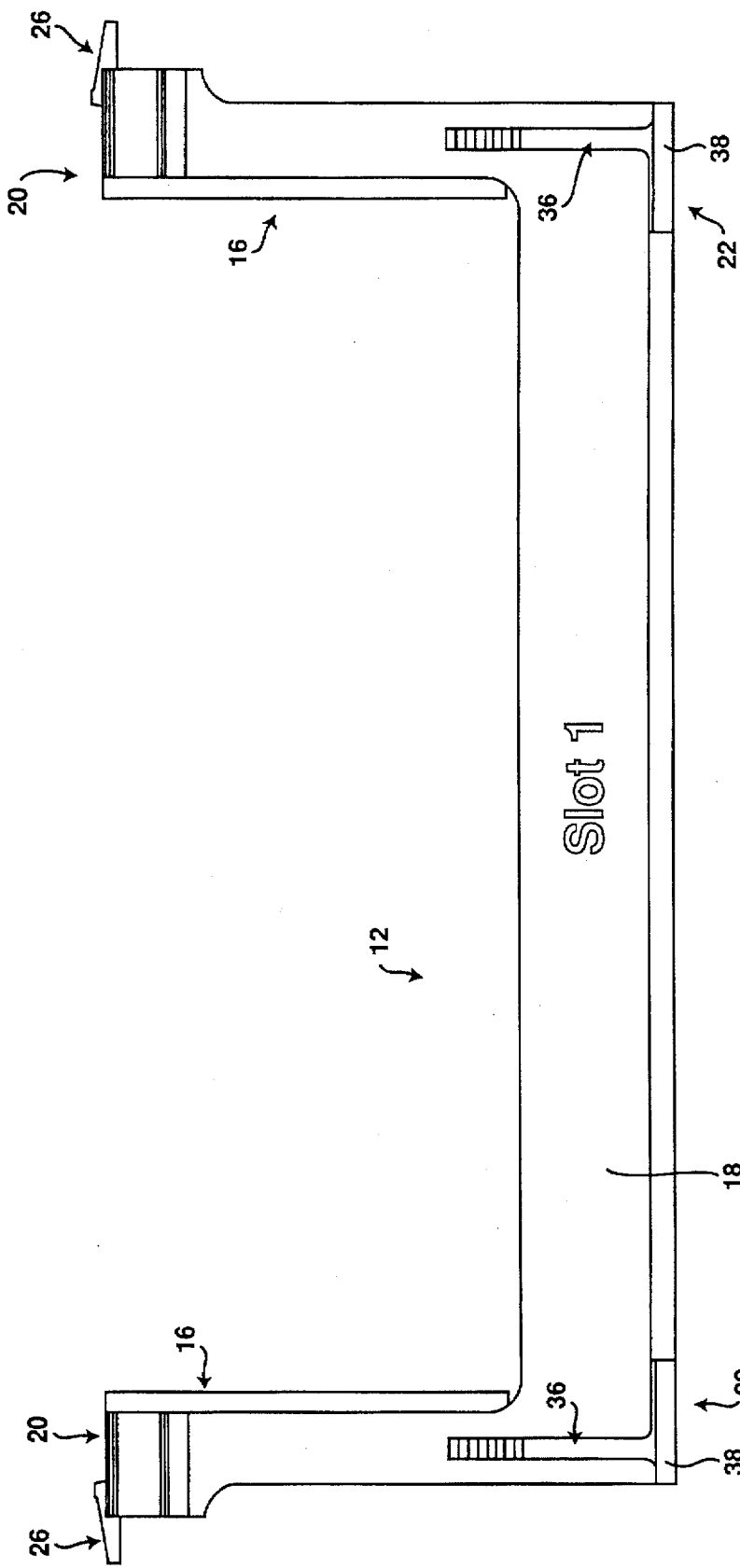
FIG. 2 is a front view of one embodiment of the circuit board retaining apparatus of the present invention.
Figure 3:
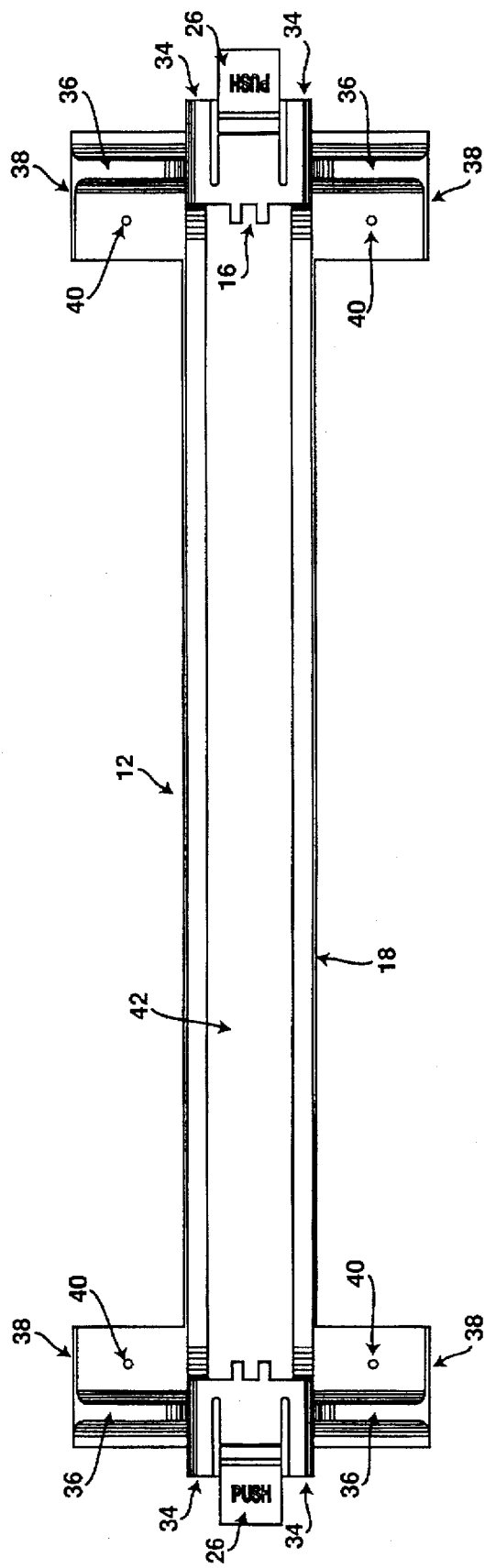
FIG. 3 is a top view of one embodiment of the circuit board retaining apparatus of the present invention.
Figure 4:
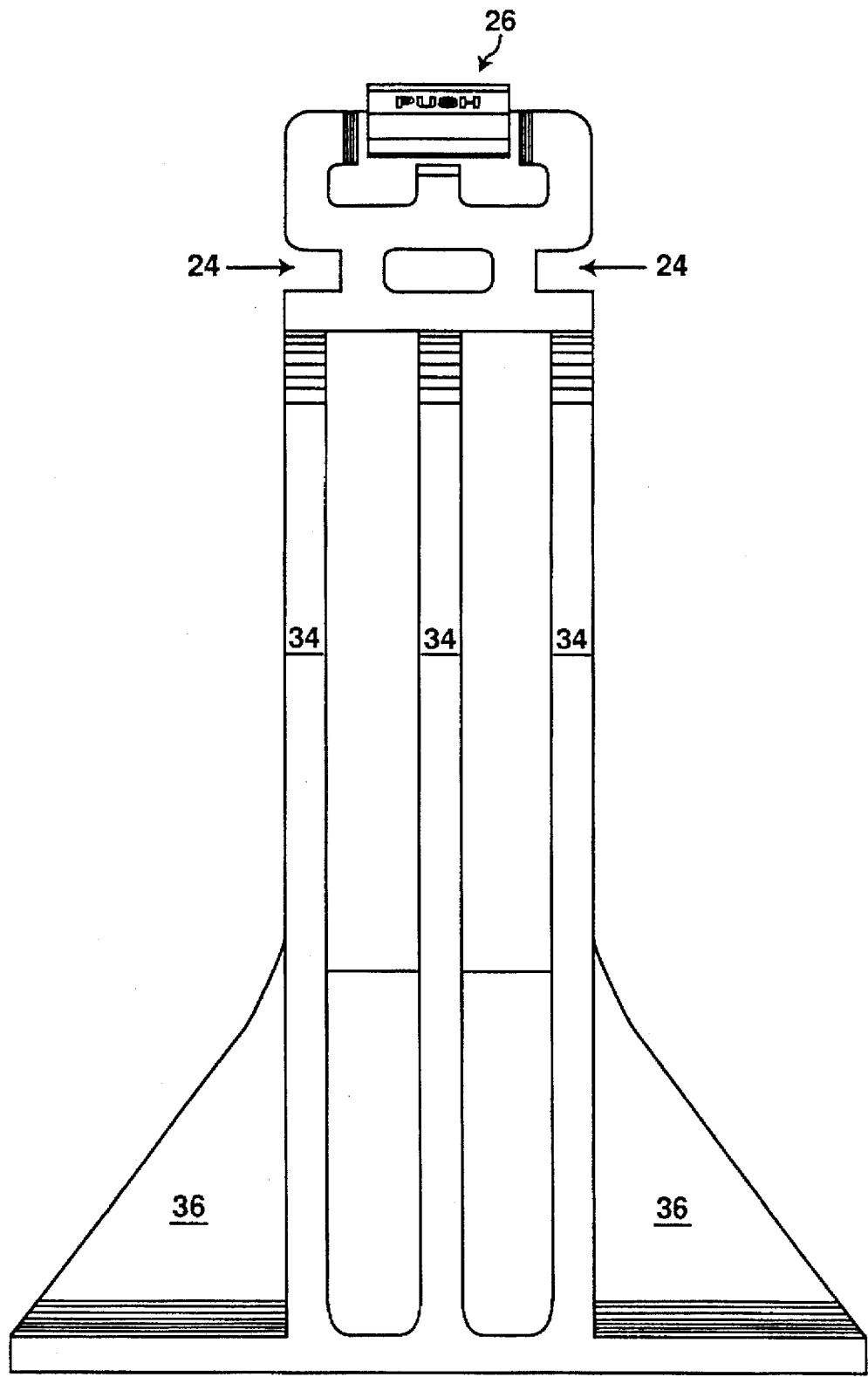
FIG. 4 is a side view of one embodiment of the circuit board retaining apparatus of the present invention.
Figure 5:
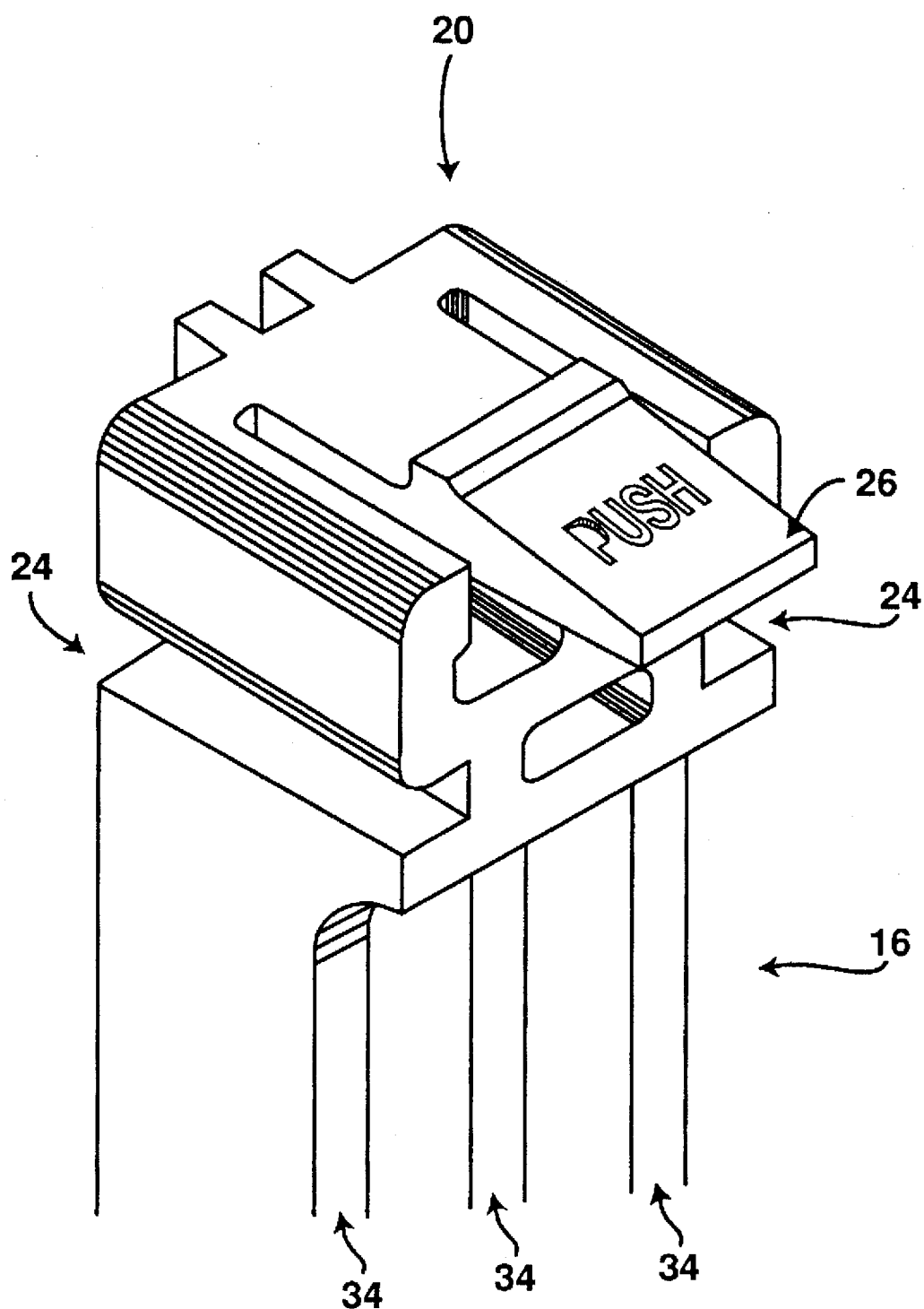
FIG. 5 is a zoom-in view of one embodiment of the top end of one of the retention arm of the circuit board retaining apparatus of the present invention.
Figure 6:
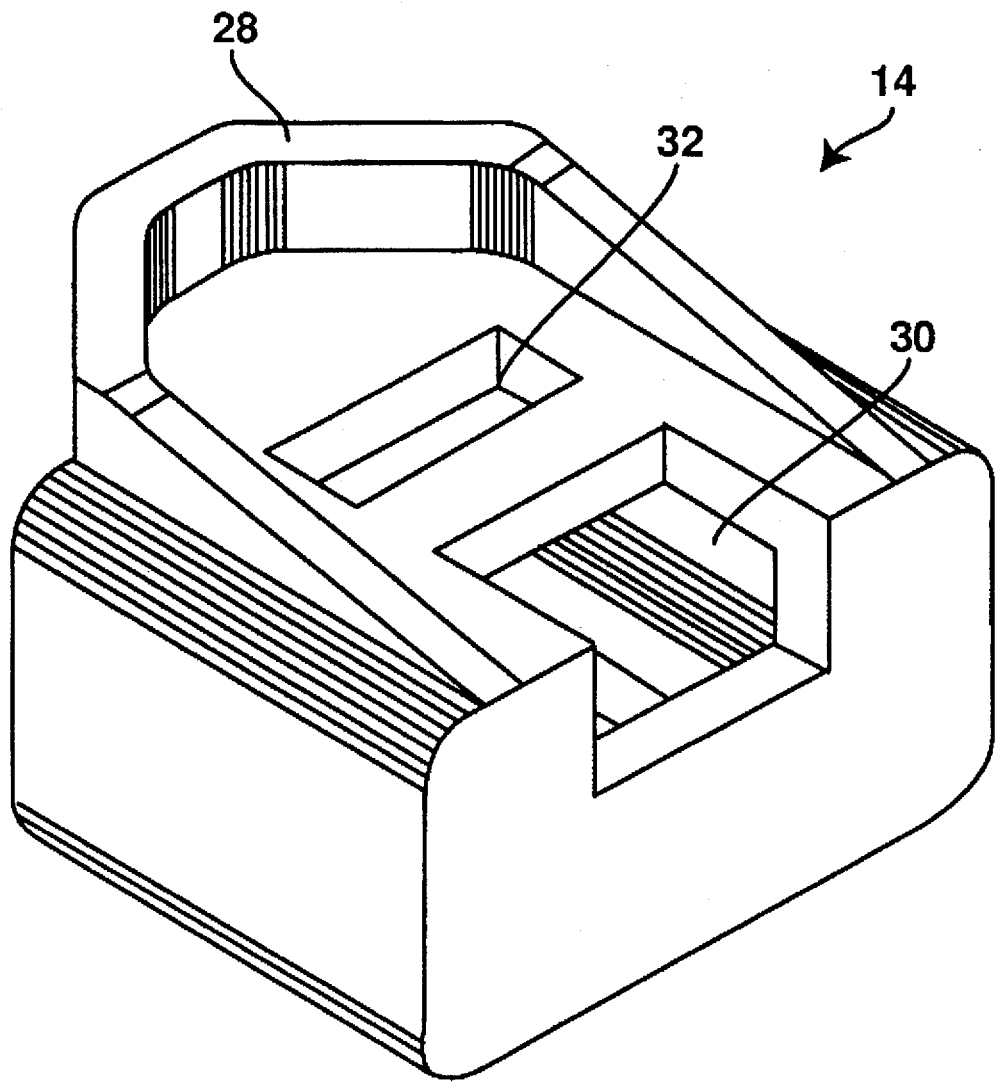
FIG. 6 is a zoom-in view of one embodiment of the sliding clip of the circuit board retaining apparatus of the present invention.

Referring now to the figures, the circuit board retention apparatus of the present invention 10 is illustrated from various views. In FIG. 1, circuit board retention apparatus 10 is shown in conjunction with circuit board 100, the circuit board being securely retained in connection to a connector (not shown). Circuit board retention apparatus 10 includes retention body 12 and slidable clips 14. For the presently preferred embodiment, retention body 12 has a uni-body construction. In other words, circuit board retention apparatus 10 has only two types of parts, body 12 and clips 14. Thus, circuit board retention apparatus 10 is very manufacturing friendly.

Retention body 12 includes retention arms 16 and longitudinal base 18 joining the two arms. For the illustrated embodiment, retention body 12 is U-shaped, exposing much of the primary and secondary surfaces 102 and 104 of circuit board 100, thereby allowing components mounted on primary surface 102 to protrude beyond retention apparatus 10. In particular, in the case of a processor daughter card having a high performance processor generating a substantial amount of heat, it allows a heat sink of substantial size to be attached to the high performance processor.

Each arm 16 has top end 20 and bottom end 22. Top end 20 is geometrically shaped, such that clip 14 can be slid onto top end 20. For the illustrated embodiment, top end 20 includes a pair of channels 24 disposed on opposing side surfaces of top end 20 to facilitate clip 14 sliding onto top end 20. Furthermore, top end 20 includes deflectable stop lever 26. Deflectable stop lever 26 can be depressed to allow clip 14 to slide over it, as clip 14 slides onto top end 20. Deflectable stop lever 26 stops clip 14 from sliding off top end 20, once clip 14 is fully or partially slid onto top end 20 beyond a predetermined distance, to be more fully described below.

Clip 14 includes a protruding extension 28, and notches 30 and 32. Protruding extension 28 is designed to engage cutout 106 of circuit board 100, and secure the particular side edge of circuit board 100, when clip 14 slides up against the side edge. Notch 30 and deflectable stop lever 26 are designed to snugly engage, when clip 14 slides up against the side edge of circuit board 100, thereby keeping clip 14 engaged with circuit board 100 and securely retaining circuit board 100 in the connected position. Notch 32 and deflectable stop lever 26 are designed to snugly engage, when clip 14 is partially slide onto top end 20, thereby allowing clip 14 to be pre-positioned on top end 20. Notches 30 and 32 and deflectable stop lever 26 are also designed to produce an audible "snap" sound, when deflectable stop lever 26 snugly engages notch 30 as well as notch 32.

In other words, at assembly time, circuit board 100 may be securely connected to its connector simply by engaging circuit board 100 with the connector, and then sliding clips 14 towards the respective edges of circuit board 100. Once clips 14 are slid up against the respective edges of circuit board 100 and deflectable stop levers 26 are engaged with notches 30 of clips 14, circuit board 100 is securely connected. Thus, circuit board retention apparatus 10 of the present invention is extremely assembly or manufacturing friendly.

For the illustrated embodiment, each retention arm 16 further includes a first plurality of ribs 34 for reinforcing retention arm 16 to keep it from bending away from circuit board 100, in the event mechanical shock and vibration results in circuit board 100 exerting an upward force against top ends 20. As will be appreciated by those skilled in the art, the bottom sides of channels 24 will exert countervailing forces against clips 24 and in turn against circuit board 100, when circuit board 100 exerts an upward force against top ends 20.

For the illustrated embodiment, each retention arm 16 further includes a second plurality of ribs 34 for reinforcing retention arm 16 to keep it from swaying in either directions orthogonal to circuit board 100, in the event mechanical shock and vibration results in circuit board 100 exerting an angled upward force (in either directions orthogonal to circuit board 100) against top end 20.

For the illustrated embodiment, each second end 22 also includes a number of extended flanges 38 for contributing to the stability of the overall structure. Each extended flange 38 includes an opening 40 for securing the structure to the backplane or motherboard, using appropriate fasteners (not shown), e.g. machines screws or plastic snap rivets.

For the illustrated embodiment, ribs 34 and 36 as well as flanges 38 are of substantially the same thickness, thereby allowing the uni-body circuit board retention apparatus of the present invention 10 to be manufactured by injection molding. Flange 38 is slightly thicker to provide a more robust surface for attachment to a motherboard.

Finally, longitudinal base 18 includes cavity 42 for allowing base 18 to fit snugly around the connector against which circuit board 100 is to be connected. In other words, under the present invention, no special features have to be added to the connector in order for circuit board retention apparatus 10 to provide the desired secured retention to circuit board 100. Thus, connectors can be independently designed and manufactured without having to take on non-connector related issues.

Figure 7C:
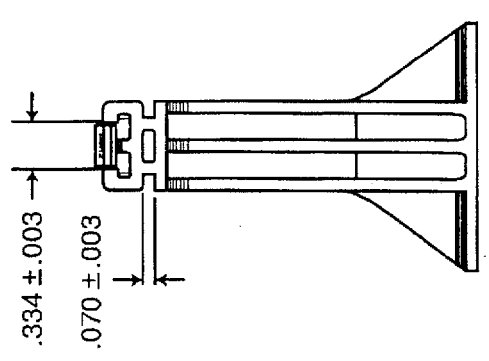
FIGS. 7a–7c illustrates selected dimensions of one embodiment of the circuit board retaining apparatus of the present invention.
Figure 7A:
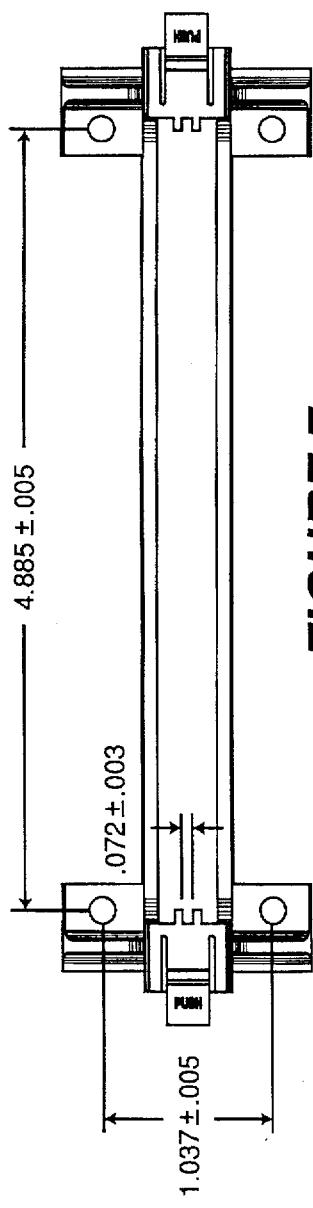
Figure 7B:
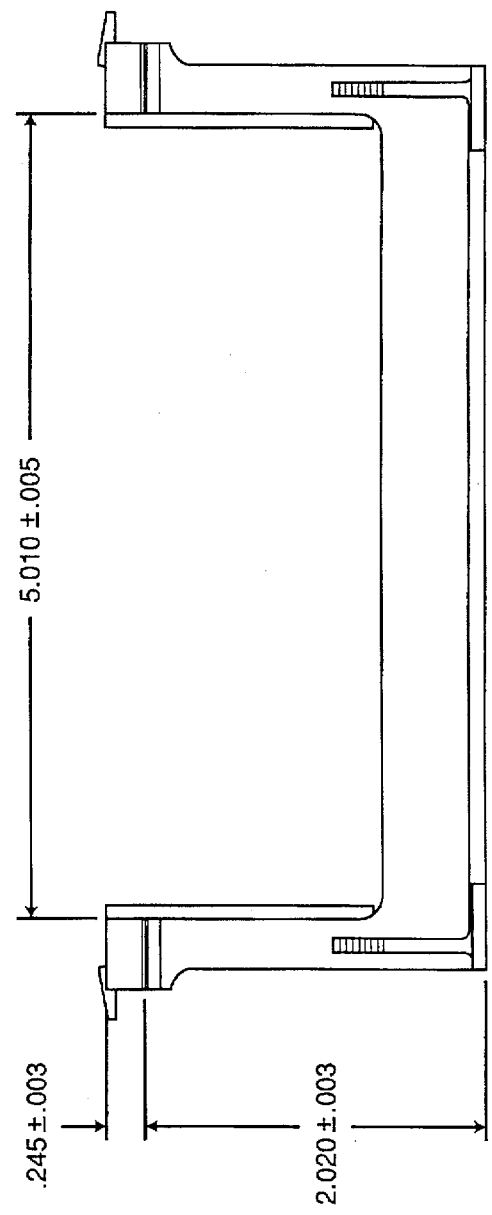

As will be appreciated by those skill in the art, the materials used, and the precise dimensions of the various aspects of retention body 12, such as the length of arms 16, the length of base 18, the thickness of ribs 34 and 36 etc. are functionally dependent on the size of circuit board 100, and the amount of shock and vibration circuit board retention apparatus 10 needs to overcome. In one application for a processor daughter card having dimensions of 2.25 in×5 in×0.062 in, the amount of shocks and vibrations apparatus 10 is required to overcome are 100 G for 6 ms duration in sawtooth waveform for shock, and 50–2000 HZ, 9 grms, and 15 min/axis for vibration, the materials used are glass filled polycarbonate for retention body 12 and zinc for clips 14. Selected dimensions for apparatus 10 are illustrated in FIGS. 7a–7c, which are top, front and side views respectively.

Thus, an apparatus for cost effectively retaining a circuit board in a connected position without increased rigidity/stability has been described. As will be appreciate by those skilled in the art, in addition to the various advantages enumerated in the above description, the apparatus of the present invention is suitable for use in virtually all the popular form factors of today's desktop personal computers.

While the method and apparatus of the present invention has been described in terms of the above illustrated embodiments, those skilled in the art will recognize that the invention is not limited to the embodiments described. The present invention can be practiced with modification and alteration within the spirit and scope of the appended claims. The description is thus to be regarded as illustrative instead of restrictive on the present invention.

What is claimed is:

1. An apparatus for securely retaining a circuit board in a connected position, said apparatus comprising a first retention arm and a first clip that cooperate with each other and a first edge of the circuit board to secure said first edge of the circuit board, said first retention arm having a first end, which is geometrically shaped to allow said first clip to slide onto said first end, and slide towards said first edge, said first clip and said first edge having first complementary engagement features for said first clip to engage said first edge as said first clip slides up against said first edge, said first end further having a first deflectable stop lever that can be depressed to allow said first clip to slide over said first deflectable stop lever as said first clip slides onto said first end and towards said first edge, and then be released to snugly engage a first notch of said first clip to prevent said first clip from sliding back off said first end after said first clip engages said first edge.

2. The apparatus as set forth in claim 1, wherein said first end includes a plurality of channels disposed on opposing side surfaces of said first end for allowing said first clip to slide onto said first end.

3. The apparatus as set forth in claim 1, wherein said first edge has a first cutout; and said first clip includes a first protruding rib for engaging said first cutout.

4. The apparatus as set forth in claim 1, wherein said first clip further includes a second notch against which said deflectable stop lever can be released to snugly engage as said first clip is sliding onto said first end, to pre-position said first clip on said first end.

5. The apparatus as set forth in claim 1, wherein said first clip is made of zinc.

6. The apparatus as set forth in claim 1, wherein said first retention arm further includes a first plurality of ribs for reinforcing said first arm from bending away from said first edge.

7. The apparatus as set forth in claim 6, wherein said first retention arm further includes a second plurality of ribs orthogonal to said first plurality of ribs for reinforcing said first arm from swaying in either direction orthogonal to said circuit board.

8. The apparatus as set forth in claim 7, wherein said first arm further includes a second end having extended flanges for contributing to stability of said apparatus.

9. The apparatus as set forth in claim 8, wherein said first and second plurality of ribs and said extended flanges are uniform in thickness.

10. The apparatus as set forth in claim 1, wherein said first retention arm is made of polycarbonate.

11. The apparatus as set forth in claim 1, wherein said apparatus further comprises a second retention arm and a second clip that cooperate with each other and a second edge of the circuit board to secure said second edge of the circuit board, said second retention arm having a second end, which is geometrically shaped to allow said second clip to slide onto said second end, and slide towards said second edge, said second clip and said second edge having second complementary engagement features for said second clip to engage said second edge as said second clip slides up against said second edge, said second end further having a second deflectable stop lever that can be depressed to allow said second clip to slide over said second deflectable stop lever as said second clip slides onto said second end and towards said second edge, and then be released to snugly engage a second notch of said second clip to prevent said second clip from sliding back off said second end after said second clip engages said second edge.

12. The apparatus as set forth in claim 11, wherein said second engagement features of said second edge and said second clip are similarly constituted as said first engagement features of said first edge and said first clip.

13. The apparatus as set forth in claim 11, wherein said second clip is similarly constituted as said first clip and made of the same material.

14. The apparatus as set forth in claim 11, wherein said second end is similarly shaped geometrically as said first end.

15. The apparatus as set forth in claim 11, wherein said second retention arm is similarly constituted as said first retention arm.

16. The apparatus as set forth in claim 11, wherein said apparatus further comprises a retention base joining said first and second retention arms, said retention base having a cavity for allowing said retention base to fit snugly over a connector to which said circuit board is connected.

17. The apparatus as set forth in claim 16, wherein said retention base and first and second retention arms are joined in a uni-body construction, manufactured by injection molding.

18. An apparatus for securely retaining a circuit board in a connected position, said apparatus comprising a first and a second retention arm, and a first and a second clip that correspondingly cooperate with each other and with a first and a second edge of the circuit board to secure said first and second edges of the circuit board respectively, said first and second retention arms having a first and a second end respectively, which are geometrically shaped to allow said first and second clips to slide onto said first and second ends, and slide towards said first and second edges respectively, said first and second clips, and said first and second edges having first and second complementary engagement features respectively for said first and second clips to engage said first and second edges as said first and second clips slide up against said first and second edges respectively, said first and second ends further having a first and a second deflectable stop lever respectively, that can be depressed to allow said first and second clips to slide over said first and second deflectable stop levers respectively, as said first and second clips slide onto said first and second ends, and towards said first and second edges respectively, and then be released to snugly engage a first and a second notch of said first and second clips respectively to prevent said first and second clips from sliding back off said first and second ends respectively after said first and second clips engage said first and second edges respectively.

19. The apparatus as set forth in claim 18, wherein said first and second ends include a first and a second plurality of channels disposed on opposing side surfaces of said first and second ends respectively for allowing said first and second chips to slide onto said first and second ends respectively.

20. The apparatus as set forth in claim 18, wherein said first and second edges have a first and a second cutout respectively; and said first and second clips include a first and a second protruding rib for engaging said first and second cutouts respectively.

21. The apparatus as set forth in claim 18, wherein said first and second clips further include a third and a fourth notch respectively against which said first and second deflectable stop levers can be released to snugly engage as said first and second clips are sliding onto said first and second ends respectively, to pre-position said first and second clips on said first and second ends.

22. The apparatus as set forth in claim 18, wherein said circuit board is a processor daughter card of a computer system.

23. An apparatus for securely retaining a circuit board in a connected position, said apparatus comprising a retention body having a first and a second retention arm, and a first and a second clip that correspondingly cooperate with said first and second retention arms, and with a first and a second edge of the circuit board to secure said first and second edges of the circuit board respectively, said first and second retention arms having a first and a second end respectively, which are geometrically shaped to allow said first and second clips to slide onto said first and second ends, and slide towards said first and second edges respectively, said first and second clips, and said first and second edges having first and second complementary engagement features respectively for said first and second clips to engage said first and second edges as said first and second clips slide up against said first and second edges respectively, said first and second ends further having a first and a second deflectable stop lever respectively, that can be depressed to allow said first and second clips to slide over said first and second deflectable stop levers respectively, as said first and second clips slide onto said first and second ends, and towards said first and second edges respectively, and then be released to snugly engage a first and a second notch of said first and second clips respectively to prevent said first and second clips from sliding back off said first and second ends respectively after said first and second clips engage said first and second edges respectively.

24. The apparatus as set forth in claim 23, wherein said first and second ends include a first and a second plurality of channels disposed on opposing side surfaces of said first and second ends respectively for allowing said first and second chips to slide onto said first and second ends respectively.

25. The apparatus as set forth in claim 23, wherein said first and second edges have a first and a second cutout respectively; and said first and second clips include a first and a second protruding rib for engaging said first and second cutouts respectively.

26. The apparatus as set forth in claim 23, wherein said first and second clips further include a third and a fourth notch respectively against which said first and second deflectable stop levers can be released to snugly engage as said first and second clips are sliding onto said first and second ends respectively, to pre-position said first and second clips on said first and second ends.

27. The apparatus as set forth in claim 23, wherein said retention body is substantially U-shaped and having a cavity at the bottom side of the U-shape for allowing said retention body to fit snugly over a connector to which said circuit board is connected.

28. The apparatus as set forth in claim 27, wherein said retention body is constituted with a uni-body construction, and manufactured by injection molding.

29. The apparatus as set forth in claim 23, wherein said circuit board is a processor daughter card of a computer system.

* * * * *